US007170142B2

(12) United States Patent
Wojcik et al.

(10) Patent No.: US 7,170,142 B2
(45) Date of Patent: Jan. 30, 2007

(54) PLANAR INTEGRATED CIRCUIT INCLUDING A PLASMON WAVEGUIDE-FED SCHOTTKY BARRIER DETECTOR AND TRANSISTORS CONNECTED THEREWITH

(75) Inventors: Gregory L. Wojcik, Ben Lomand, CA (US); Lawrence C. West, San Jose, CA (US); Thomas P. Pearsall, Paris (FR)

(73) Assignee: Applied Materials, Inc., Santa Clara, CA (US)

( * ) Notice: Subject to any disclaimer, the term of this patent is extended or adjusted under 35 U.S.C. 154(b) by 294 days.

(21) Appl. No.: 10/854,075

(22) Filed: May 26, 2004

(65) Prior Publication Data

US 2005/0104684 A1   May 19, 2005

Related U.S. Application Data

(60) Provisional application No. 60/508,421, filed on Oct. 3, 2003.

(51) Int. Cl.
*H01L 31/00* (2006.01)
(52) U.S. Cl. .................. 257/449; 385/129; 385/40; 359/34; 362/610
(58) Field of Classification Search .............. 257/449, 257/54, 73; 385/129–132, 2, 40; 117/918; 359/34; 362/610
See application file for complete search history.

(56) References Cited

U.S. PATENT DOCUMENTS

| 3,603,847 | A | 9/1971 | Shepherd, Jr. et al. ...... 317/234 |
| 3,757,123 | A | 9/1973 | Archer et al. ................. 250/83 |
| 4,482,778 | A | 11/1984 | Anderson ..................... 136/246 |
| 4,482,779 | A | 11/1984 | Anderson ..................... 136/255 |
| 4,555,622 | A | 11/1985 | Glass et al. ................. 250/211 |
| 4,555,790 | A | 11/1985 | Betts et al. .................. 250/211 |
| 4,565,422 | A | 1/1986 | Seymour et al. .......... 350/96.19 |
| 4,583,818 | A | 4/1986 | Chen et al. ............... 350/96.19 |
| 4,765,705 | A | 8/1988 | Seymour et al. .......... 350/96.15 |
| 4,857,973 | A * | 8/1989 | Yang et al. .................... 257/73 |
| 5,567,954 | A | 10/1996 | Dobson et al. ................. 257/3 |
| 5,625,729 | A | 4/1997 | Brown ......................... 385/31 |
| 5,685,919 | A | 11/1997 | Saito et al. .................. 136/259 |
| 5,757,477 | A | 5/1998 | Nikitin et al. ............... 356/128 |

(Continued)

OTHER PUBLICATIONS

Sellai, A., and Dawson, P., "Quantum efficiency in GaAs Schottky photodetectors with enhancement due to surface plasmon excitations", *Solid State Electronics*, vol. 46, 2002, pp. 29-33.

*Primary Examiner*—Douglas W. Owens
(74) *Attorney, Agent, or Firm*—Robert M Wallace

(57) ABSTRACT

A planar integrated circuit includes a semiconductor substrate having a substrate surface and a trench in the substrate, a waveguide medium in the trench having a top surface and a light propagation axis, the trench having a sufficient depth for the waveguide medium to be at or below said substrate surface, and at least one Schottky barrier electrode formed on the top surface of said waveguide medium and defining a Schottky barrier detector consisting of the electrode and the portion of the waveguide medium underlying the Schottky barrier electrode, at least the underlying portion of the waveguide medium being a semiconductor and defining an electrode-semiconductor interface parallel to the light propagation axis so that light of a predetermined wavelength from said waveguide medium propagates along the interface as a plasmon-polariton wave.

44 Claims, 13 Drawing Sheets

U.S. PATENT DOCUMENTS

| | | | |
|---|---|---|---|
| 6,052,238 A | 4/2000 | Ebbesen et al. | 359/738 |
| 6,122,091 A | 9/2000 | Russell et al. | 359/245 |
| 6,178,275 B1 | 1/2001 | Nerses et al. | 385/14 |
| 6,301,282 B1 | 10/2001 | Capasso et al. | 372/46 |
| 6,441,298 B1 | 8/2002 | Thio | 136/250 |
| 6,442,321 B1 | 8/2002 | Berini | 385/130 |

\* cited by examiner

PLANAR INTEGRATED CIRCUIT INCLUDING A PLASMON WAVEGUIDE-FED SCHOTTKY BARRIER DETECTOR AND TRANSISTORS CONNECTED THEREWITH

CROSS-REFERENCE TO RELATED APPLICATIONS

This application claims priority of U.S. Provisional Application Ser. No. 60/508,421, filed Oct. 3, 2003 entitled A PLANAR INTEGRATED CIRCUIT INCLUDING A PLASMON WAVEGUIDE-FED SCHOTTKY BARRIER DETECTOR AND TRANSISTORS CONNECTED THEREWITH by Gregory Wojcik, et al. and assigned to the present assignee.

This application contains subject matter related to U.S. application Ser. No. 10/280,492 filed Oct. 25, 2002 entitled OPTICAL READY WAFERS by Lawrence West et al. and assigned to the present assignee, and U.S. application Ser. No. 10/280,505 filed Oct. 25, 2002 entitled OPTICAL READY SUBSTRATES by Claes Bjorkman, et al. and assigned to the present assignee.

BACKGROUND

Schottky barrier detectors are used as optical detectors in night vision applications, for example, in which photons in the far infrared range, typically in the 10 micron wavelength region, are detected. Typically, a semiconductor such as silicon is employed with an overlying Schottky electrode of a metal material chosen to provide a very low (0.1–0.2 ev) Schottky barrier energy across the metal-semiconductor Schottky interface. In a Schottky detector, the incoming light is incident on the overlying metal Schottky electrode, in a direction generally normal to the electrode surface. Electrons in the metal electrode absorb incident photons and are thereby given sufficient energy to cross the Schottky energy barrier (between the metal and semiconductor layers) and flow into the semiconductor layer, resulting in a photo current across the device.

Schottky barrier detectors have not been generally employed in optical communication systems, which tend to operate at shorter wavelengths in the range of about 1 to 3 microns. This is because a Schottky detector is typically less efficient than other types of detectors in this wavelength range. And, detector efficiency in a long-range optical communication system is critical.

The efficiency of a Schottky barrier detector is determined by a number of factors, including the geometry of the electrode or metal layer. This is because the incident light, generally normal to the electrode surface, is absorbed by electrons during its passage through the thin metal layer. The probability of absorbing all incident photons is enhanced in a thicker electrode layer. But, as the metal electrode layer thickness is increased, the number of photo-excited electrons that actually reach the semiconductor-metal interface is reduced by collision losses within the metal electrode. Thus, optimizing photon absorption in the Schottky electrode is difficult and depends upon controlling the very small dimension of the Schottky electrode thickness.

In summary, it has not seemed practical to use a Schottky detector for optical communications because high detector efficiency is so important, and because controlling detector efficiency requires difficult or expensive process control over the Schottky electrode thickness.

The invention that will be described below in this specification arose during consideration by the inventors herein of the problem of integrating an optical waveguide and an optical detector in a planar integrated circuit as a locally distributed optical communication system operating at a short wavelength (e.g., 1.3 microns). A locally distributed optical communication system envisioned by the inventors herein could distribute a global clock signal in a VLSI integrated circuit (for example) via a network of optical waveguides, to reduce power consumption associated with conventional electrical distribution of the clock signal. One problem is that in such a system, the waveguide would be complex (e.g., it might need a number of terminations equal to the number of detectors to be fed by the waveguide). A solution needed to be found that would provide a very simple and easily fabricated waveguide/detector structure.

One problem with a conventional Schottky barrier detector integrated with a waveguide, such as that described in U.S. Pat. No. 4,857,973, is that its structure cannot be easily combined in a planar integrated circuit structure. This is because such a device is not planar, in that the waveguide is a rib above the plane of the integrated circuit. This feature is necessary in order to establish a difference in refractive index around the rib that confines light travelling through the rib. Such a structure cannot be combined in a planar VLSI integrated circuit because the fabrication and performance of such a circuit requires a planar structure. In a planar structure, structural features in the semiconductor substrate are below the top surface of the substrate, the surface of the substrate being reserved for overlying insulator layers and such features as conductor lines, and, in some cases, silicon-on-insulator transistor structures, for example.

The problem is how to integrate a Schottky barrier detector with a waveguide in a planar VLSI integrated circuit.

SUMMARY OF THE INVENTION

A waveguide medium and Schottky barrier detector integrated with the waveguide medium are buried inside a semiconductor substrate of a planar integrated circuit, so that the integrated waveguide and Schottky barrier detector are generally below or co-planar with the plane of the substrate, thus providing a planar integrated circuit structure. The waveguide medium can be surrounded by a wall having an index of refraction different from that of the waveguide medium. The wall can be separately formed or may be the substrate itself. The Schottky barrier detector is connected to transistors in the planar integrated circuit via overlying conductor layers of the integrated circuit. The waveguide feeds a light beam to be detected to a Schottky barrier detector parallel to and in the plane of the electrode-semiconductor interface of the Schottky barrier detector. Optical absorption of the Schottky detector is determined by the length of the electrode along the direction of the light beam, which can be easily controlled to a high degree of accuracy by conventional photolithography, a significant advantage.

One feature of this structure is that the light propagates at least in part as plasmon-polariton waves along the electrode-semiconductor interface. A plasmon-polariton (surface plasmon) is an interface wave whose distribution has evanescent tails on each side of the interface. An advantage is that such plasmon-polariton waves increase the amount of light near the metal-semiconductor interface (where the light is most likely to be absorbed and contribute to the photocurrent of the Schottky detector). This enhances the Schottky barrier detector efficiency.

A structure integrating the buried Schottky barrier detector described above and a buried waveguide is realized in a planar integrated circuit structure by forming a Schottky barrier electrode directly on (contacting) a portion of the buried waveguide. In one example, plural Schottky barrier optical detectors are provided at spaced intervals along the length of the buried waveguide by forming respective metal electrodes over successive portions of the waveguide. The various lengths of the Schottky electrodes along the direction of the waveguide may be adjusted to provide suitable apportionment of the light among the plural Schottky barrier detectors. The waveguide media is a semiconductor, either in those portions of the waveguide underlying the successive Schottky barrier electrodes, or throughout the entire waveguide.

DETAILED DESCRIPTION OF THE INVENTION

Figure 1A:
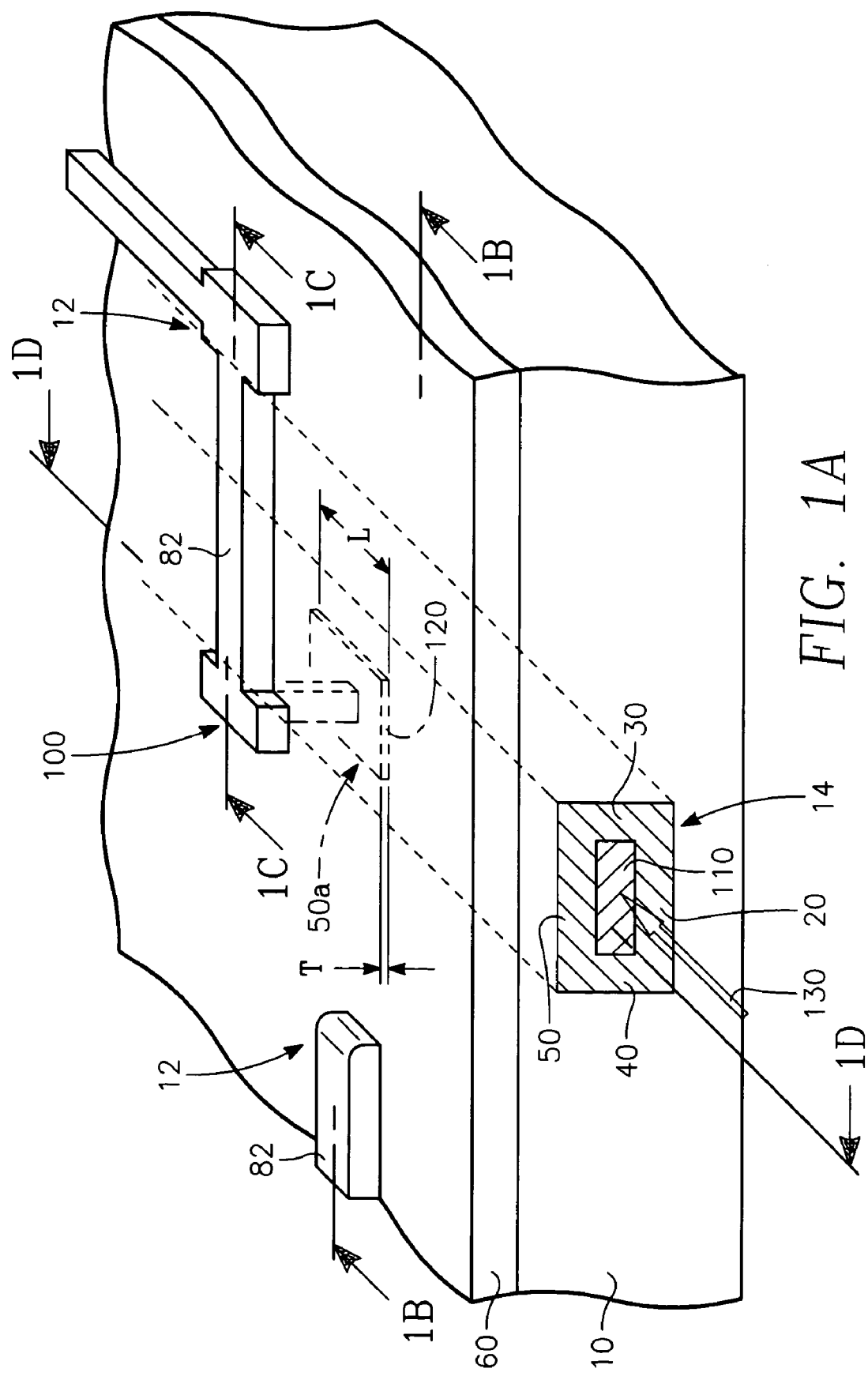
FIG. 1A is a perspective view of a planar integrated circuit including a waveguide and a Schottky barrier detector integrated with the waveguide in a planar fashion conformal with the planar structure of the integrated circuit.

Referring to FIGS. 1A through FIGS. 1D, a VLSI integrated circuit having a planar structure is formed on a semiconductor substrate 10 including plural transistors 12 formed therein and a buried elongate optical waveguide 14 at least generally beneath the top surface of the semiconductor substrate 10. The semiconductor substrate 10 is typically a silicon wafer, although the substrate 10 may be a silicon layer formed on a semiconductor wafer. The waveguide 14 is a total internal reflection (TIR) waveguide. It consists of an elongate medium or semiconductor layer 110 surrounded on its four sides by a horizontal base layer 20 formed on the substrate 10, a pair of parallel elongate vertical wall layers 30, 40 extending up from the base layer 20, and a ceiling layer 50. The medium, semiconductor layer or core 110 has a different (e.g., higher) index of refraction than the surrounding walls/layers 20, 30, 40, 50. If the elongate core or medium 110 is a semiconductor such as silicon or silicon-germanium, then the surrounding layers 20, 30, 40, 50 consist of a material having an index of refraction that is different from (lower than) the index of refraction of the core 110, such as silicon dioxide (if the core 110 is silicon) or silicon (if the core 110 is silicon-germanium), for example. In the case of a silicon-germanium core 110 and silicon surrounding layers 20–50, the proportion of germanium in the silicon-germanium core 110 determines its index of refraction. If the core 110 contains 5% germanium and 95% silicon, the refractive index is 3.52 at a wavelength of 1300 nm, which is greater than the refractive index (3.50) of the surrounding 100% silicon layers 20–50 at that wavelength. The core's refractive index may be further increased by increasing the proportion of germanium. At 100% germanium, the index of refraction is 4.0.

The ceiling layer 50 has a window 50a in which a metal layer 120 is deposited to form a buried Schottky barrier detector 100 integrated with the buried waveguide 14. All the features of the integrated waveguide-detector structure 14, 100 are at or below the plane of the top surface of the substrate 10. In the illustrated embodiment, the waveguide-detector structure 14 is buried well below the top surface of the substrate 10. An advantage is that the waveguide-detector structure 14, 100 is completely integrated with the planar integrated circuit so that the waveguide-detector structure 14, 100 does not interfere with other structures or layers overlying the substrate 10 and may be connected to other devices in the integrated circuit via the overlaid conductor structures provided in such an integrated circuit. While the core 110 is illustrated in FIG. 1A as having a rectangular cross-section, it may have any suitable cross-section, as will be seen later in this description, such as a U-shape, capable of supporting an optical waveguide mode.

The top surface of the waveguide-confining ceiling 50 is below (or, alternatively, co-planar with) the top surface of the semiconductor substrate 10. For this purpose, the waveguide 14 is buried in an elongate trench formed in the top surface of the semiconductor substrate 10. This preserves the plane of the top surface of the semiconductor substrate 10 for deposition of other features, such transistor devices and an insulator layer. For example, a field oxide layer 60 (formed of silicon dioxide, for example) covers the entire structure. Transistors 12 are formed in or on the semiconductor substrate 10 in the conventional manner. The transistors may be formed by implanting source and drain regions in the substrate 10 and forming insulated polysilicon gates over the source-to-drain channels, in the well-known manner. Alternatively, the transistors 12 may be formed as silicon-on-insulator devices by forming semiconductor islands on an oxide layer over the substrate 10 for connection to the Schottky barrier detector, as will be described later in this specification. In such a case, the transistors are well above the surface of the semiconductor substrate 10.

Figure 2A:
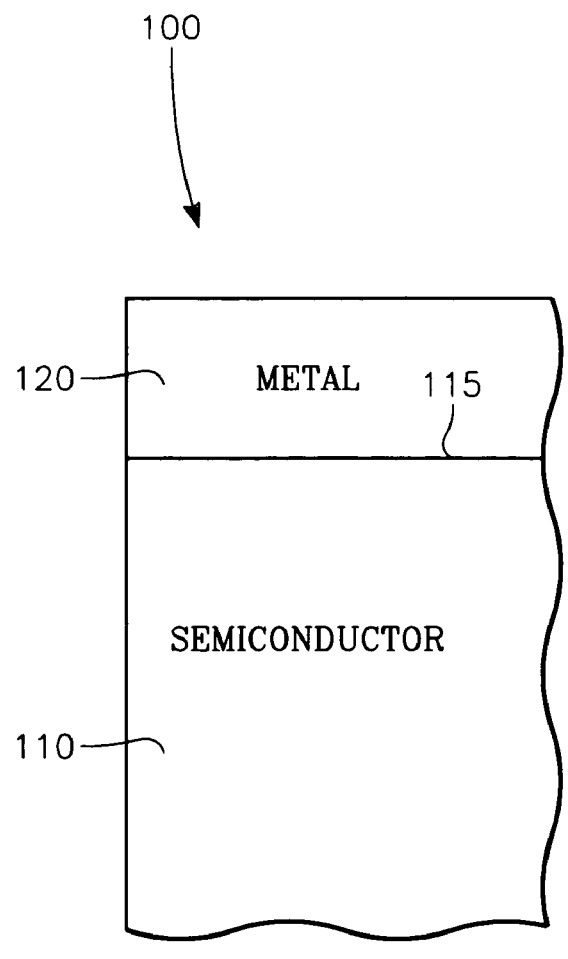
FIG. 2A is an enlargement of a portion of FIG. 1C.
Figure 2B:
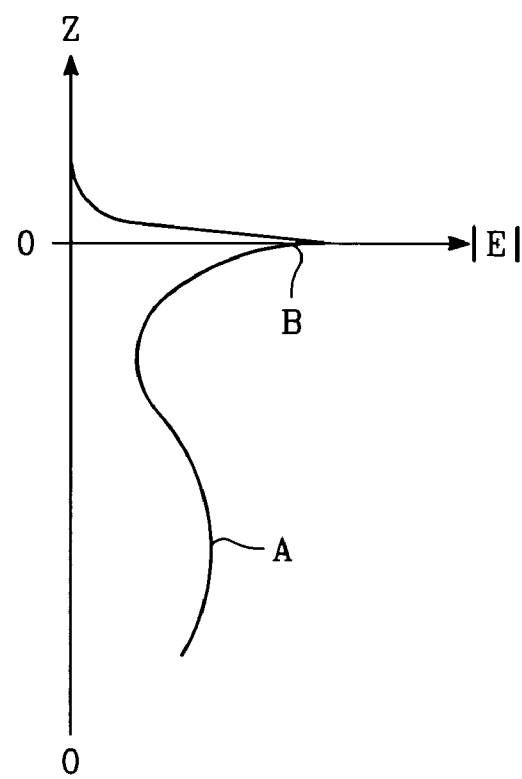
FIG. 2B is a graph of the plasmon-confined photon electric field (plasmon-polariton) as a function of location relative to the metal-semiconductor interface of the planar waveguide-detector of FIG. 1A.

The Schottky barrier detector 100 consists of the semiconductor layer 110 and the overlying metal layer or electrode 120. The electrode contacts the top surface of the semiconductor layer 110 to form a planar interface 115 therebetween. An incoming light beam 130 is guided in a direction parallel to the planar interface 115 and also parallel to the length L of the electrode 120. The incoming light beam 130 is incident on and normal to an imaginary planar edge face 132 formed by imaginary co-planar side edge faces 110a, 120a of the semiconductor layer 110 and the electrode 120, respectively. The photons of the incoming light beam 130 couple to a plasmon-polariton mode near the interface 115, so that the light propagates at least in part along the plane of the interface 115 as a plasmon-polariton wave. The plasmon-polaritons thus created are confined about the interface 115 in a thin region 140 that extends along at least most of the length L of the electrode 120. The direction of light propagation is parallel to the electrode length L. The confined distribution of the plasmon-polariton electric field within the region 140 is illustrated in the graph of FIG. 2B, in which the vertical axis corresponds to the Z direction of FIG. 2A perpendicular to the interface 115 and the horizontal axis corresponds to the optical electric field strength. The optical electric field distribution illustrated in FIG. 2B has two peaks: one peak ("A") generally coincides with the center of the waveguide core 110, and is attributable to the optical waveguide mode of the core 110 along its entire length; the other peak ("B") occurs only at the electrode-semiconductor interface 115, and is attributable to the plasmon-polariton mode. The plasmon-polariton peak "B" of the optical field represents an increase in the amount of light at the interface 115 and therefore corresponds to an increase in detector response, a significant advantage.

Figure 1B:
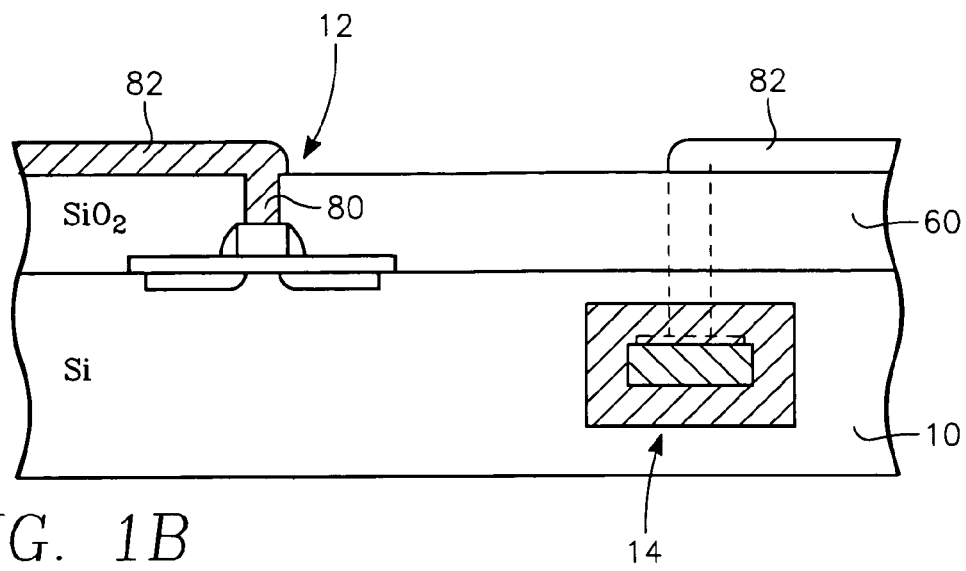
FIGS. 1B, 1C and 1D are cross-sectional views taken along lines 1B—1B, 1C—1C and 1D—1D, respectively, of FIG. 1A.
Figure 1C:
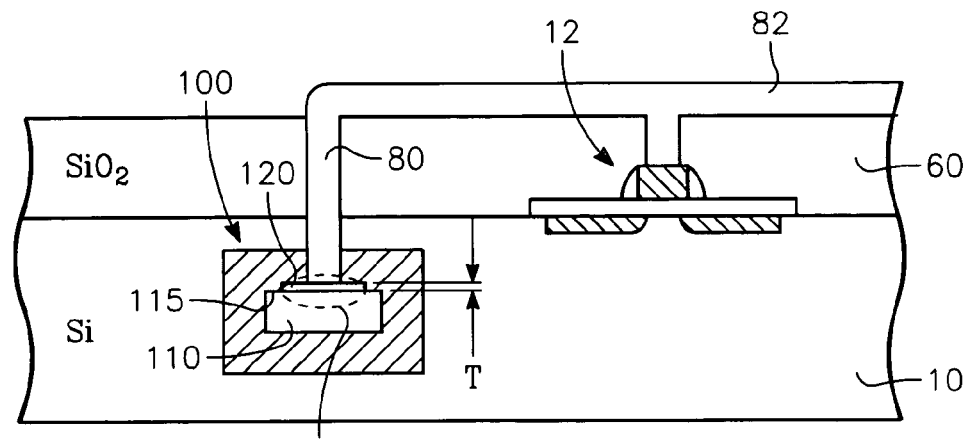
Figure 1D:
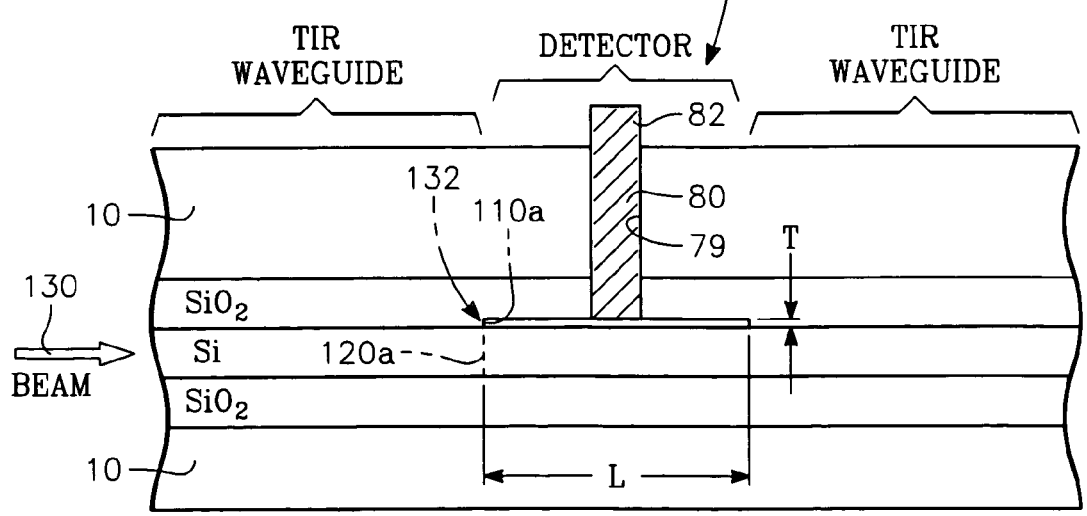

The integrated circuit includes plural transistors 12, one of which is visible in the cross-sectional view of FIG. 1B and another of which is visible in the cross-sectional view of FIG. 1C. The transistors 12 may be formed by implanting source and drain regions 72, 74 in the top surface of the semiconductor substrate, forming a thin gate oxide layer 76 over the channel region between each source and drain 72, 74 and forming a polysilicon gate 78 over each thin gate oxide layer 76. The insulator (silicon dioxide) layer 60 is formed next, and then contact openings 79 are formed in the insulator layer 60 to each of the sources 72, each of the drains 74, each of the gates 76, to each of the waveguide cores 110 and to each of the Schottky barrier electrodes 120. Only some of the foregoing contact openings are visible in various ones of the drawings of FIGS. 1A–1D. A metal layer 80 fills the contact openings 79 and forms metal connector lines 82 over the top surface of the insulator layer 60. However, as will be described below, the transistors may be formed above the silicon substrate 10 as silicon-on-insulator (SOI) devices in isolated silicon islands. The metal interconnect layer 82 provides some interconnections between certain transistors 12 and the Schottky barrier detector 100, as shown in FIGS. 1A and 1C. FIG. 1C shows, for example, a metal line 82 connecting the gate of one of the transistors 12 to the Schottky barrier electrode 120.

As shown in FIG. 2B, most of the electric field associated with the plasmon-polariton peak "B" is in the semiconductor core 110. Propagation in the semiconductor core 110 is less lossy than in the metal 120, so that the light travels mainly through the semiconductor layer 110. Photons traveling in the semiconductor layer 110 next to the interface 115 are absorbed by the metal layer 120 by interaction with electrons that are excited by the absorbed photons. The excited electrons, under the influence of a negative D.C. bias voltage applied to the electrode 120, cross the interface from the metal layer 120 into the semiconductor layer 110 to create a photocurrent. The increased photon flux in the region 140 at the interface 115 associated with the plasmon-polariton peak "B" increases the flux of absorbed photons in the metal electrode 120, thereby enhancing the detector efficiency.

A dominating factor in determining the fraction of the photons absorbed in the Schottky detector 100 is the length L of the electrode 120. Increasing the length L increases the surface interaction with the light beam at the interface 115, thereby increasing the fraction of the incoming photons that are absorbed into electrode 120 and thus increasing the resulting photocurrent. The electrode length L may be chosen to set the fraction of absorbed photons to any desired fraction or percentage, up to nearly 100%. This fraction may be accurately determined using conventional photolithographic techniques to appropriately set the length L of the electrode 120. It is limited, however, by optical propagation losses inherent in the plasmon-polariton mode (through the region 140).

The electrode thickness T should exceed the skin depth of the metal electrode 120 at the wavelength of the light beam 130 in order to ensure some photon absorption (by preventing loss of photons by transmission through the electrode 120). However, the electrode thickness T should be less than about half the electron mean free path length in the metal electrode 120 avoid electron collision losses within the electrode 120 that would otherwise prevent photo-excited electrons in the electrode 120 from reaching the interface 115 and crossing into the semiconductor layer 110. For example, if the electrode 120 is aluminum and the semiconductor layer 110 is silicon and the wavelength of the light beam 130 is 1.3 microns, then the skin depth is about 50 nm and half the electron mean free path length is about 1 micron, and T should lie between these two values. The electrode thickness may be selected to be on the low side of this range (e.g., T=2 nm) so that the electrode 120 presents less of an optical discontinuity in the waveguide 110. For example, the electrode thickness T may be between about 1 and 2 nm while the thickness of the core 110 may be between about 1 and 2 microns.

Figure 3A:
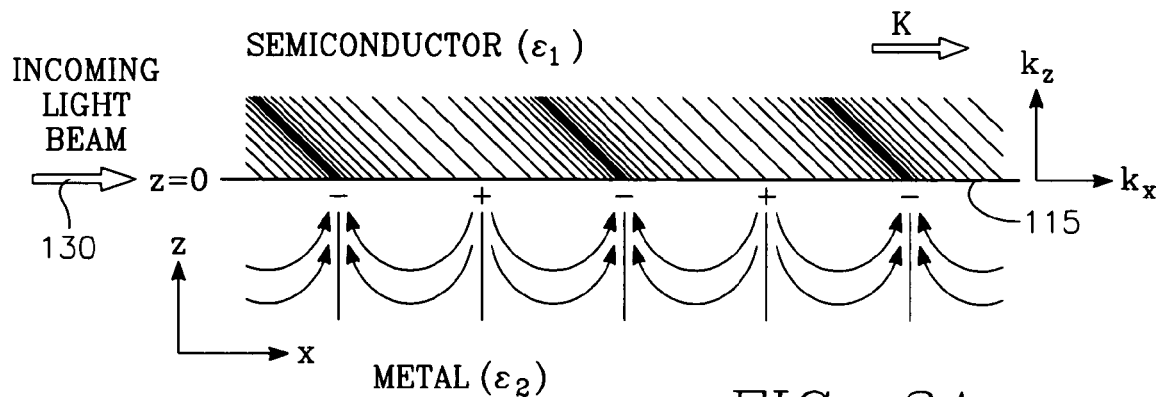
FIG. 3A is a diagram depicting an incoming lightbeam along the metal-semiconductor interface and the resulting photon-induced plasmon modes in the planar waveguide-detector of FIG. 1A.

FIG. 3A depicts a plasmon-polariton mode induced by the incoming light beam 130 along the metal-semiconductor interface 115. The plasmon-polariton mode is manifested as oscillations in electron density distribution in the metal material at the interface 115 (depicted in the shading on the surface of the interface 115 in FIG. 3A). These oscillations propagate along the X axis (parallel to the plane of the interface 115 and parallel with the incoming light beam 130) with wave numbers Kx and Kz along the X and Z axes respectively. The photon wave number K of the incoming light beam 130 is also along the X axis.

Figure 3B:
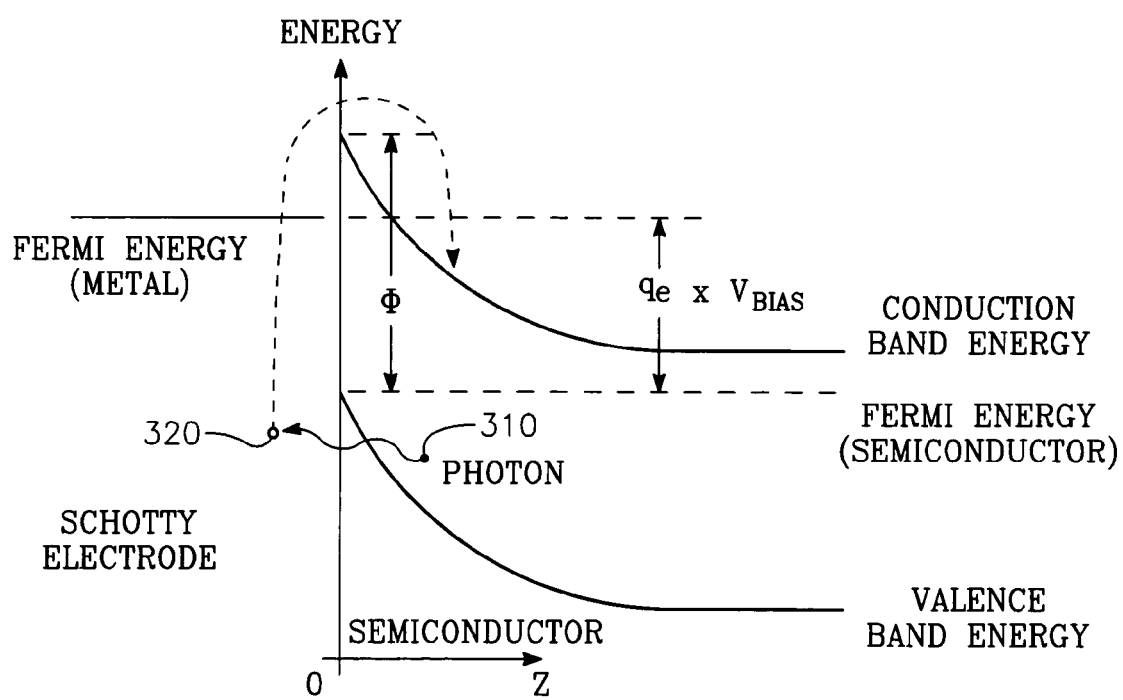
FIG. 3B is a diagram depicting an energy band structure of the planar waveguide-detector of FIG. 1A under reverse D.C. bias.

FIG. 3B depicts the energy band structure in the metal and semiconductor layers 120, 110 at the interface 115. Electron energy is plotted as a function of location along the Z axis for the following: a conduction energy band in the semiconductor layer 110, a valence energy band in the semiconductor layer 110, a Fermi energy level in the semiconductor layer 110 and a Fermi energy level in the metal layer 120. The metal and semiconductor Fermi levels are shifted from one another by the applied reverse bias voltage, as indicated in the drawing of FIG. 3B. The semiconductor layer 110 may be intrinsic or nearly so. For example, if the semiconductor layer 110 is silicon and the electrode 120 is aluminum, the dopant impurity concentration in the semiconductor layer 110 should not exceed 10E17/cc (e.g., in order to avoid formation of an Ohmic contact at the interface 115). When the metal layer 120 is formed on the semiconductor layer 110, electrons flow across the interface 115 (generally from the metal layer 120 to the semiconductor layer 110) until the Fermi energy level is uniform across the interface 115. This creates a depletion layer in the semiconductor layer 110 at the interface 115, whose electric field distorts the conduction and valence band structure in the semiconductor layer 110, increasing the conduction and valence band energy levels at the interface 115. The resulting energy barrier (of height Φ) between the Fermi level in the metal layer 120 and the semiconductor conduction band energy at the interface 115 is determined by the choice of materials for the semiconductor and metal layers 110, 120.

FIG. 3B symbolically depicts the absorption across the interface 115 of a photon 310 in an N-type semiconductor layer 110 (e.g., traveling through the plasmon-induced waveguide region 140 of FIG. 1) by an electron 320 in the metal layer 120. The photon 310 energy, hv, absorbed by the electron 320 exceeds the Schottky barrier height, Φ, enabling the electron 320 to cross the interface 115 into the conduction band of the semiconductor layer 110 (under the influence of the D.C. reverse bias voltage applied to the electrode 120), giving rise to a photocurrent across the interface 115. The Schottky barrier detector 100 is functional for photon energies lying above the Schottky barrier energy height Φ and the band gap energy of the semiconductor layer 110. Photon energies within this range generally are capable of coupling to the plasmon-polariton modes of the metal-semiconductor interface 115. For an aluminum-silicon Schottky barrier detector, the semiconductor band gap energy is 1.14 ev and the barrier height is about 0.2 ev. This range accommodates a short photon wavelength range of 1.3 to 1.5 microns useful for optical communication systems and which is capable of coupling to plasmon-polariton modes in the Schottky electrode-semiconductor interface. The negative D.C. bias voltage applied to the electrode 120 may be quite small, for example in the range of 0.5 to 1.0 volts if the electrode 120 is aluminum and the semiconductor layer 110 is silicon.

The light beam 130 incident at the interface 115 of the detector 100 of FIG. 1 may be guided by a waveguide (not shown) that is external of the detector 100. Such an external waveguide would be (at least at its output end) parallel to the plane of the interface 115 and normal to the edge or end face 132 of the detector 100, and would terminate at end face 132. In order to couple more light from the external waveguide to the plasmon-polariton region 140 associated with the plasmon-polariton peak "B" of FIG. 2B, the distance between the peaks "A" and "B" of FIG. 2B could be reduced. This could be accomplished by more nearly matching the cross-section of the plasmon-polariton region 140 of the detector 100 to the center of the external waveguide. Such a match may be optimized by adjusting the lateral width W of the electrode 120. This feature will be described later in this specification.

Figure 4A:
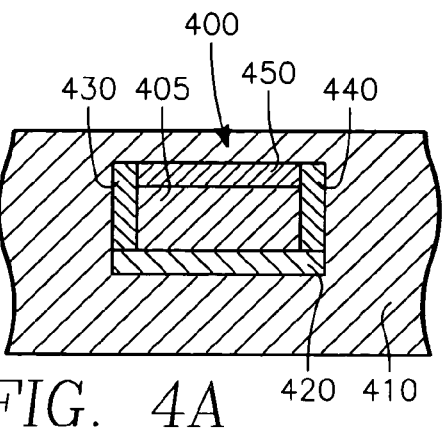
FIGS. 4A, 4B and 4C are end, side and perspective views, respectively, of an implementation including plural planar integrated waveguide-detectors of the type shown in FIG. 1A.
Figure 4B:
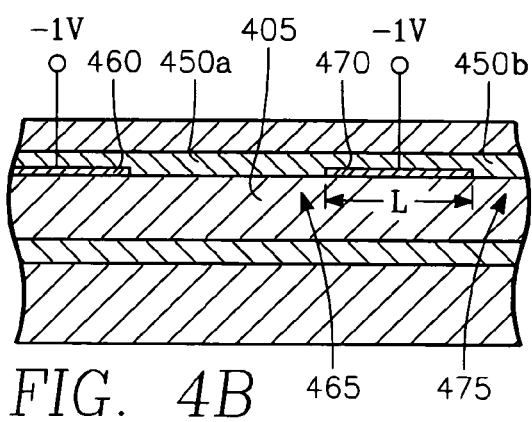
Figure 4C:
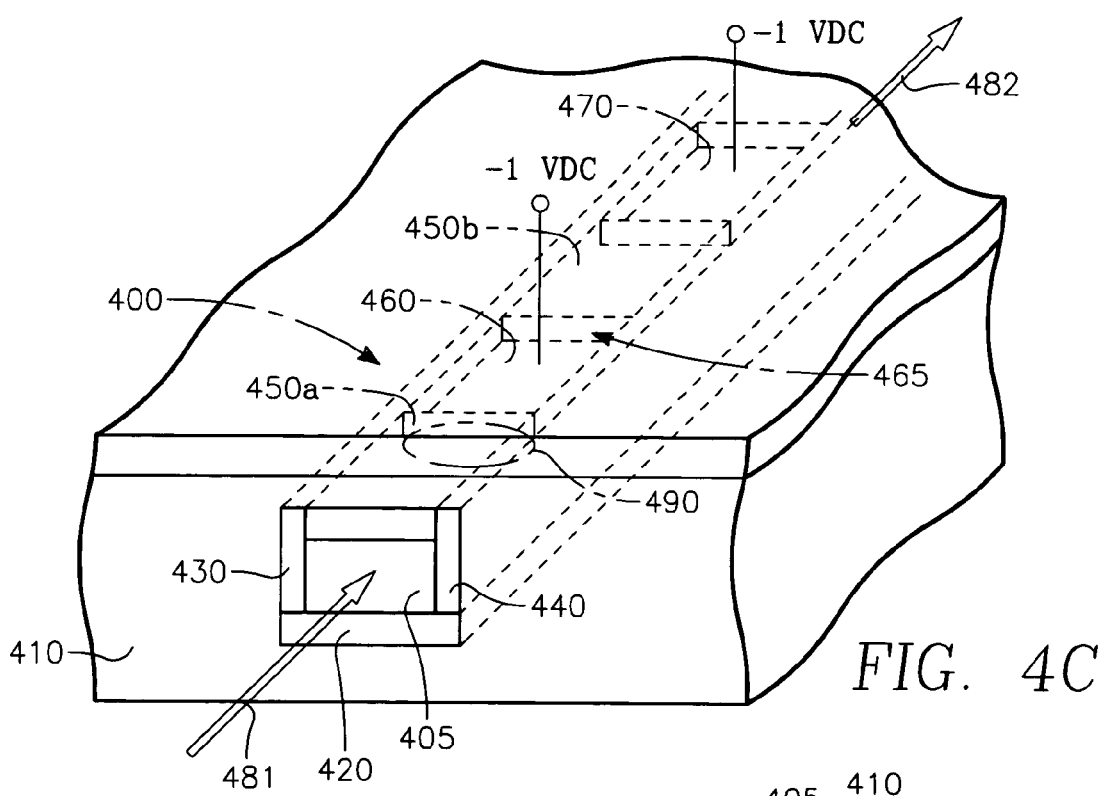

FIGS. 4A, 4B and 4C show how the structure of FIG. 1A can accommodate plural Schottky barrier detectors. As in FIG. 1A, the waveguide 400 is a total internal reflection (TIR) waveguide buried in an integrated circuit substrate 410 and includes an elongate medium 405 surrounded on its four sides by a horizontal base layer 420, a pair of parallel elongate vertical wall layers 430, 440 extending up from the base layer 420, and a ceiling layer 450, all of which are buried in the substrate 410. The waveguide medium or core 405 is a semiconductor and has a different (i.e., higher) index of refraction than the surrounding walls/layers 420, 430, 440, 450. If the elongate core or medium 405 is a semiconductor such as silicon or silicon-germanium, then the surrounding layers 420, 430, 440, 450 consist of a material having an index of refraction that is different from (lower than) the index of refraction of the core 405, such as silicon dioxide (if the core 405 is silicon) or silicon (if the core 405 is silicon-germanium), for example.

The ceiling layer 450 divided along its length into successive sections (e.g., sections 450a, 450b), separated by openings or spaces through which successive Schottky barrier electrodes are deposited on the semiconductor core 405. For example, the sections 450a, 450b are separated by an opening or space of length L, this space permitting deposition of a thin metal Schottky barrier electrode 460 of length L on the top surface of the semiconductive core or medium 405. The opening or space of length L is then refilled with the same type of material that was removed to form the opening. The electrode 460 corresponds to the Schottky barrier electrode 120 of FIG. 1. Thus, a first Schottky barrier detector 465 consists of (a) the first electrode 460 and (b) the region of the semiconductor core or medium 405 directly underlying the electrode 460.

The next space between successive sections of the ceiling 450 permits deposition of a second thin Schottky barrier electrode 470 on the semiconductor core 405. This forms a second Schottky barrier detector 475 consisting of the second electrode 470 and the region of the semiconductor core or medium 405 directly underlying the second electrode 470.

Depending upon the electrode length L of the first Schottky barrier electrode 460, only a fraction of the incoming light beam 481 (e.g., about 10%) may be absorbed or lost in the first Schottky barrier detector 465, the remaining fraction being carried downstream through the waveguide 400 (with effectively no losses) as a residual light beam 482 for detection/absorption in the second Schottky barrier detector 475. The waveguide medium 405 may be continuous as illustrated in the drawings of FIGS. 4A, 4B and 4C and is the semiconductor layer for each successive Schottky barrier detector 465, 475. The core 405 is also the waveguide propagation medium for successive waveguide sections connecting successive pairs of Schottky detectors (e.g., the waveguide section feeding the incoming light beam 481 to the first detector 465 and the waveguide section lying between the Schottky barrier detectors 465, 475).

The waveguide walls 420, 430, 440, 450 are illustrated as being continuous along the entire length of the dielectric medium 405, except where the ceiling 450 has been temporarily opened to accommodate the deposition of each Schottky barrier electrode 120. Once the Schottky barrier electrodes 120 are deposited on the core 405, the openings may be re-filled.

Each Schottky barrier detector 465, 475 integrated with the waveguide 400 is generally the same as the Schottky barrier detector 100 of FIG. 1 in structure and operation. The waveguide core or medium 405 may have a width on the order of about 3λ and a height on the order of about 1λ.

Figure 4D:
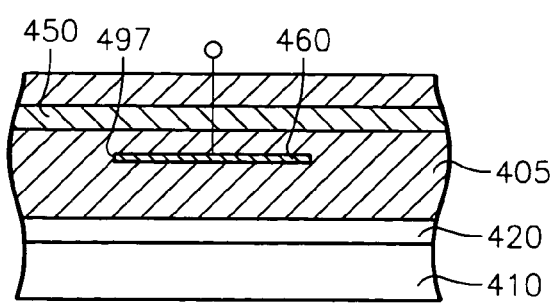
FIGS. 4D and 4E are cross-sectional side and top views, respectively, illustrating a modification in which the plasmon-polariton induced waveguide is more closely aligned with the center of the waveguide core.

Generally, in the waveguide 400, the region of maximum intensity is the axial center of the core 405, corresponding to the peak "A" of FIG. 2B, the intensity falling off with distance from the center of the core 405. The waveguide has only a single peak in its optical distribution, namely the peak "A" of FIG. 2B generally at the center of the waveguide or core 405. Referring to FIG. 4D, the plasmon-polariton region 490 in the detector 465 corresponds to the plasmon-polariton induced waveguide confinement region 140 of FIG. 1 and the plasmon-polariton peak "B" of FIG. 2B, while the center of the waveguide core 405 corresponds to the waveguide peak "A" of FIG. 2B. In order to align the plasmon-polariton region 490 closer to the center of the core 405, the Schottky electrode 460 may be placed within a sunken hallow 497 etched in the core 405. This has the desirable effect of decreasing the distance between the waveguide and plasmon-polariton peaks "A", "B" of FIG. 2B so as to increase the amount of light coupled from the external portion of the waveguide into the plasmon-polariton region 140 at the interface 115. After deposition of the electrode 460, the hallow 497 may be re-filled. This step may require a highly conformal photolithographically defined etch step in which a small periphery of the electrode 460 is removed in order to remove any metal deposition on the side wall of the hallow 497 prior to the re-filling step. In order to avoid having to perform such an etch step, another way of forming the electrode 460 at the depth of the sunken hallow 497 is to initially make the entire core 405 at only a fraction of its desired thickness. Specifically, the partially formed core 405 is abbreviated at a thickness at which the top surface of the abbreviated core 405 coincides with the bottom of the sunken hallow illustrated in FIG. 4D. The electrode 460 is then deposited and photolithographically defined on the top of the abbreviated core 405. Thereafter, the remainder of the core 405 is deposited until the core 405 attains the core thickness illustrated in FIG. 4B.

Figure 4E:
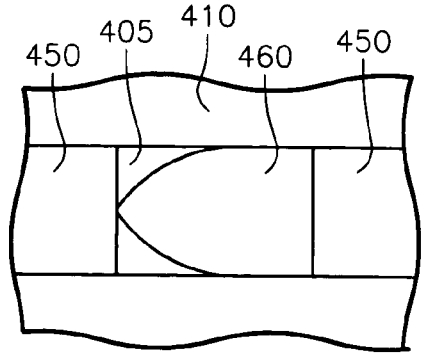

In order to reduce reflection losses at the edge of the electrode 460 protruding into the core 405, the electrode 460 may have a wedge shape in the horizontal plane, as illustrated in FIG. 4E. The wedge outline may be curved to enhance the optical impedance match between the portion of the waveguide 400 outside of the detector 465 and the plasmon-polariton region 490 in the detector 465. The curved wedge outline may be an adiabatic curve.

Figure 5:
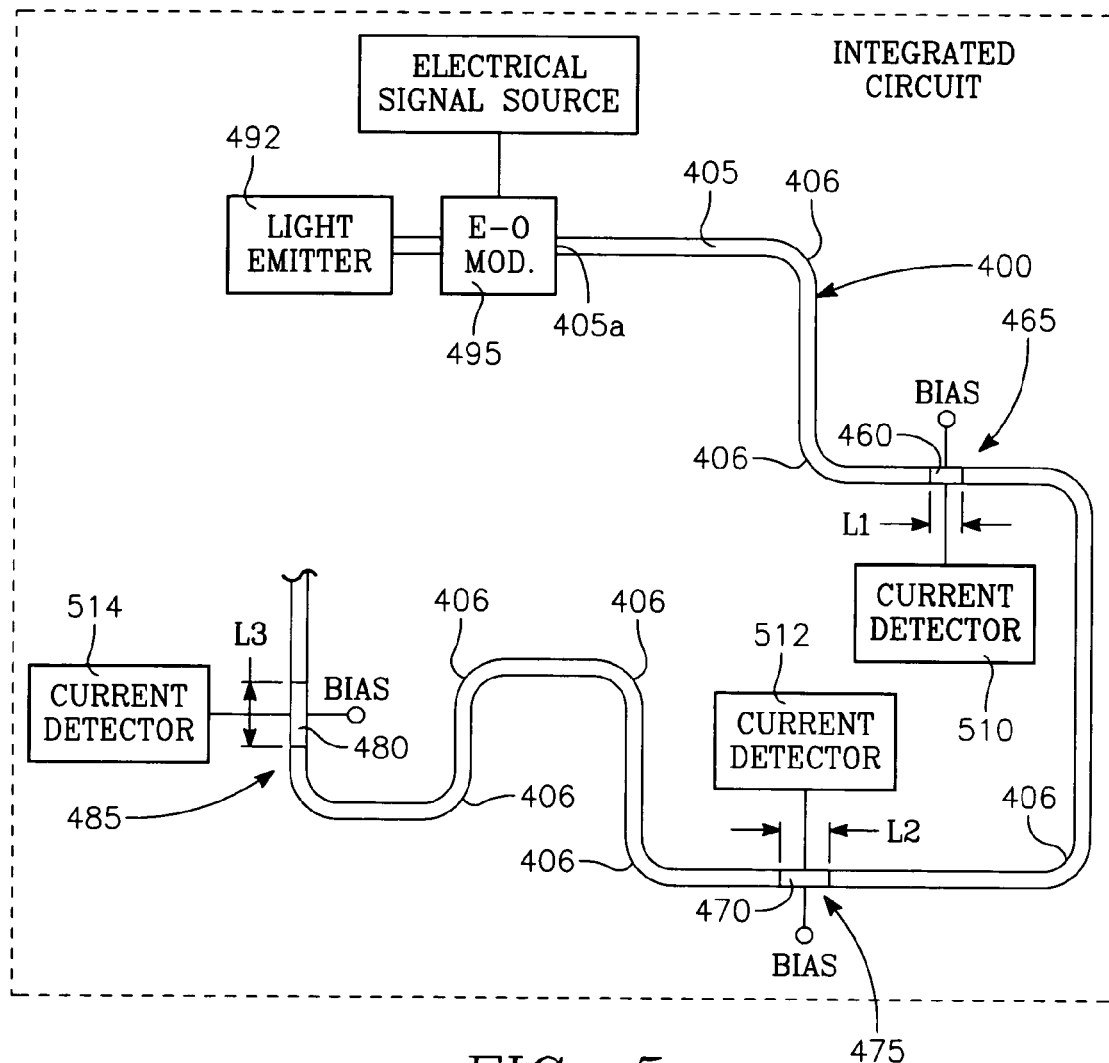
FIG. 5 is a top views of an integrated circuit including a waveguide integrated with successive Schottky barrier detectors.

FIG. 5 illustrates an integrated circuit incorporating the integrated waveguide/detector structure of FIGS. 4A, 4B and 4C, but having three Schottky electrodes 460, 470, 480 on the semiconductor medium 405 forming three respective Schottky barrier detectors 465, 475, 485 at spaced apart intervals along the length of the semiconductor waveguide medium 405. In FIG. 5, the waveguide medium 405 forms an elongate optical path having several turns 406. Each turn 406 is formed as a suitable radius in the manner illustrated (or, alternatively, incorporates a mirror) in order to prevent light escaping from the waveguide medium 405 in the vicinity of the turn 406. The integrated circuit includes individual current detector circuits 510, 512, 514, connected to respective Schottky barrier electrodes 460, 470, 480. The lengths of the electrodes 460, 470, 480 are selected so that light absorption by successive detectors 465, 475, 485 is balanced among the detectors, whereby each detector absorbs at least approximately the same amount of light. For example, assuming no unrecoverable losses of light, the length L1 of the first electrode 460 is the shortest so that the first detector 465 absorbs only about a third of the incoming light beam. The second electrode 475 has an longer (intermediate) length L2 enabling it to absorb about one half the light admitted past the first detector 465. The third electrode 480 has the longest length of all, L3, so that the third detector 485 absorbs all of the remaining light (i.e., the light admitted past the second detector). Of course, the electrode lengths may be apportioned so that the detectors absorb different amounts of light, if desired. While there are three Schottky barrier detectors 465, 475, 485 integrated with the waveguide 400 in FIG. 5, any suitable number of detectors may be integrated with the waveguide 400 in the manner illustrated.

FIG. 5 shows that the path of the integrated Schottky barrier detector/waveguide structure may meander throughout the integrated circuit as needed, so that the current detectors 510, 512, 514 (which output the electrical version of the modulation signal carried by the light beam) may be placed at any desired location on the integrated circuit. Thus, a signal carried by the light beam propagating through the waveguide can be delivered to any desired location on the integrated circuit.

As shown in FIG. 5, there is a continuous waveguide medium 405 forming the waveguide 400 providing a single light path consisting of alternate sections arranged serially of (a) conventional waveguides between detectors and (b) plasmon-polariton enhanced Schottky barrier detectors. The alternate sections may be of the same (semiconductor) material so as to form a continuum or—as will be described below—may be alternately semiconductor material (in the detectors) and dielectric material (in the waveguide sections between detectors).

The light conducted by the waveguide 400 of FIG. 5 may be supplied by an emitter 492 coupled to one end of the waveguide 400 formed by a termination face 405a of the waveguide medium 405. The light beam may be modulated in accordance with an electronic signal (e.g., a clock signal produced on the integrated circuit) by an electro-optic modulator 495. The emitter 492 may be a laser, so that the waveguide 400 and the electro-optic modulator may be single mode optical devices. If the emitter is an LED, then the waveguide 400 and the electro-optic modulator would need to be multi-mode optical devices.

Figure 6:
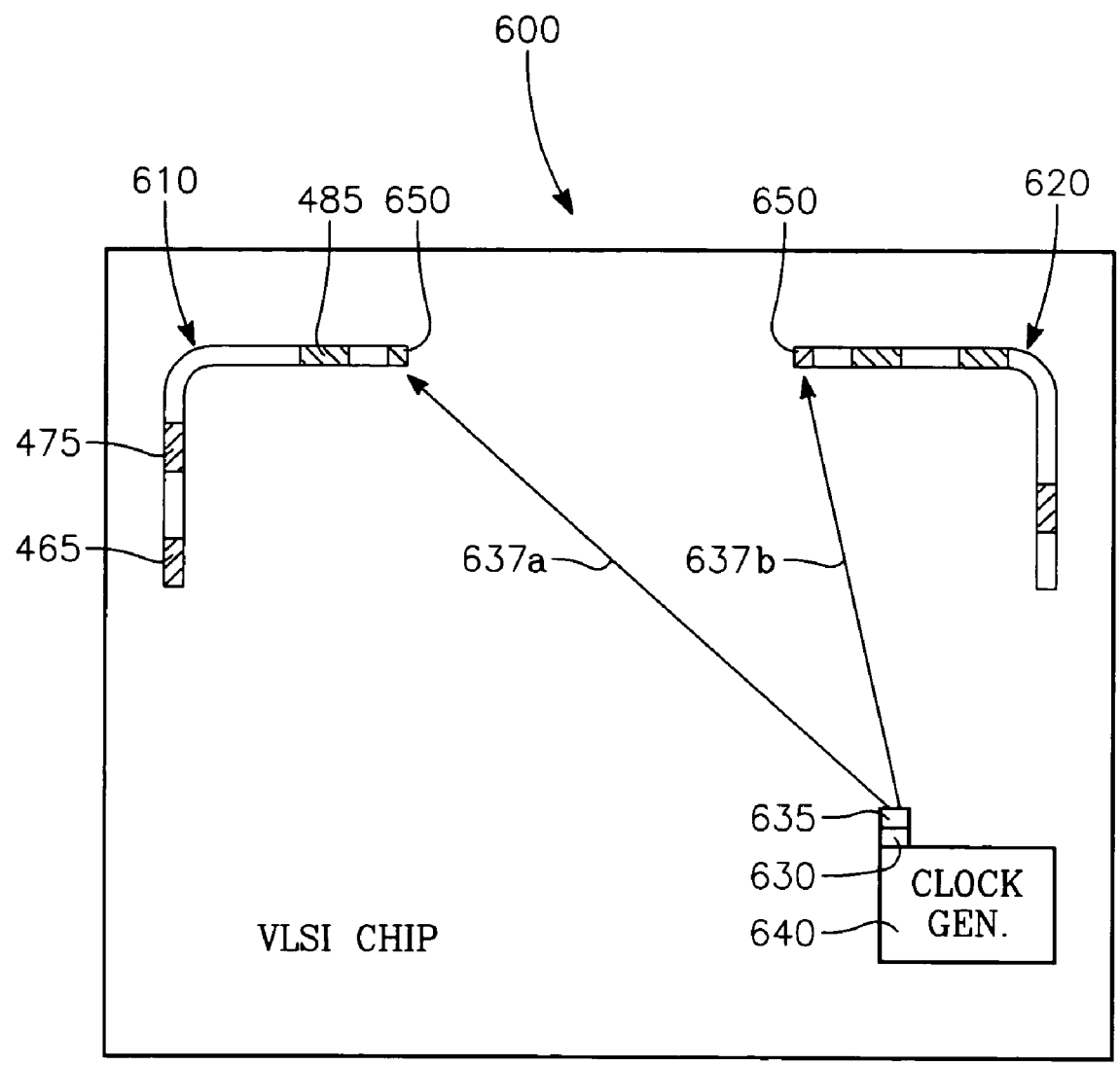
FIG. 6 is a top view of a VLSI integrated circuit with respective waveguides in different zones, each integrated with plural Schottky detectors.

FIG. 6 illustrates how copies 610, 620 of the integrated waveguide/detector structure of FIG. 5 may be placed in different zones of an integrated circuit 600, and receive light beams 637a, 637b transmitted above the surface of the integrated circuit from a single light emitter 630 having a beam splitter 635. The light emitter 630 may be driven by a global clock signal generator 640 (as one example). Each integrated waveguide/detector structure 610, 620 may include its own prism-like element 650 (such as a butt-coupled optical fiber, or a diffraction grating, for example) to pull the free-space propagating light beam 637 into the waveguide. Each of the individual integrated waveguide/detector structures 610, 620 includes three Schottky detectors 465, 475, 485 that distribute the optically communicated clock signal to different circuits in the neighborhood or zone of the waveguide.

Figure 7A:
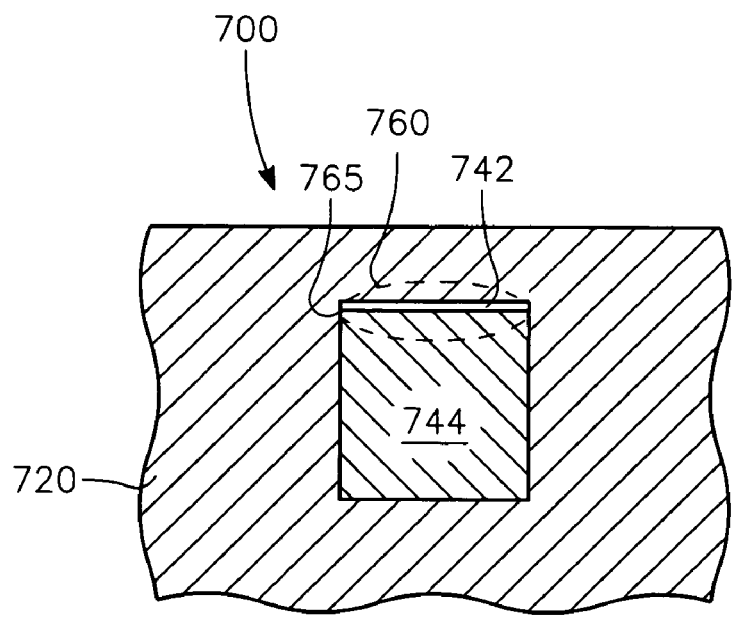
FIGS. 7A and 7B are cross-sectional end and cross-sectional side views, respectively, of another implementation employing a dielectric waveguide core.
Figure 7B:
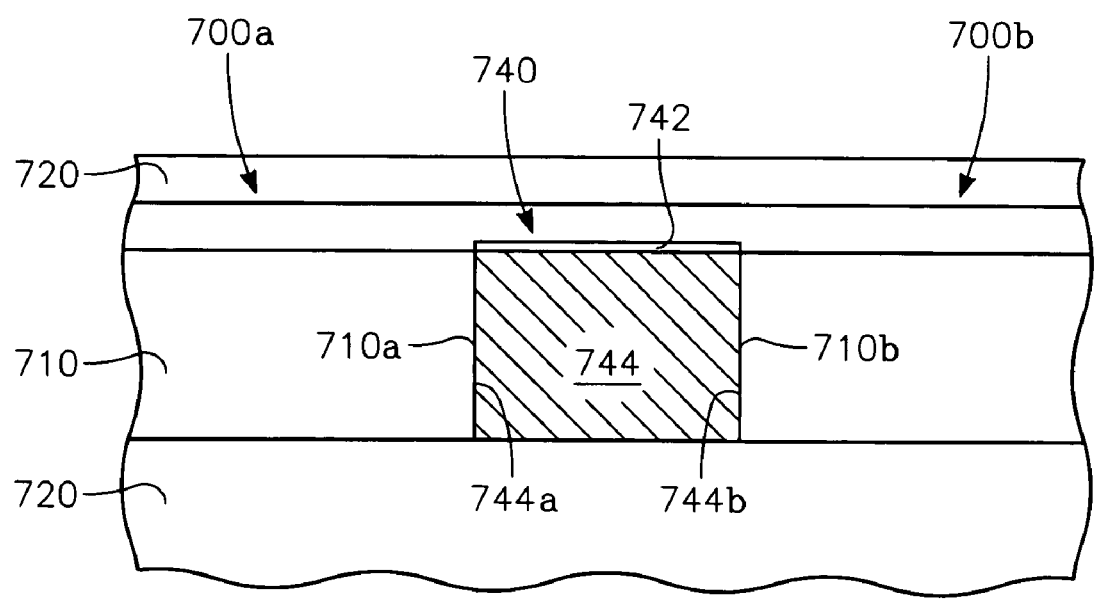

The integrated waveguide/detector structure of FIGS. 4A, 4B and 4C employs a TIR waveguide having a continuous semiconductor core or medium 405 surrounded by side walls of a higher index of refraction. If the semiconductor medium 405 is silicon, then the wavelength of the light must be above the optical cutoff wavelength of silicon, i.e., about 1.2λ. However, a different waveguide may be employed having a dielectric medium or core. For example, an optical fiber could be employed as the waveguide. Or, as shown in FIGS. 7A and 7B, a waveguide 700 having a dielectric (rather than semiconductor) propagation medium may be employed in lieu of the waveguide 400 of FIG. 4A. The dielectric material may be transparent at wavelengths shorter than 1.2λ. Referring to FIGS. 7A and 7B, an elongate dielectric layer or core 710 is buried in an integrated circuit substrate 720, the dielectric core 710 forming the propagation medium of the waveguide 700. The dielectric core 710 may be surrounded (if needed) by waveguide walls or layers (not shown) having lower indices of refraction. However, such walls may be unnecessary, depending upon whether the refractive index of the core 710 exceeds that of the substrate 720. The waveguide 700 is divided into sections, for example the sections 700a, 700b. The sections 700a and 700b are separated by a space that accommodates a Schottky barrier detector 740 identical in structure to the Schottky barrier detector 100 of FIG. 1. The Schottky barrier detector 740 includes a semiconductor layer 744 defined by two opposing parallel end faces 744a, 744b abutting respective end faces 710a, 710b of the dielectric medium 710 at the boundaries of the two waveguide sections 700a, 700b. The Schottky barrier detector 740 further includes a metal Schottky electrode 742 on a top surface of the semiconductor layer 744. The waveguide 700 may have an ideal cross-sectional shape close to or nearly aligned with a plasmon-polariton region 760 around the interface 765 between the electrode 742 and the semiconductor layer 744. The plasmon-polariton region 760 corresponds to the plasmon-polariton region 140 of FIG. 1 in which light is concentrated at the semiconductor-electrode interface 765.

Figure 8A:
FIGS. 8A through 8P illustrate respective steps of a process for fabricating a planar integrated circuit including a planar integrated waveguide and Schottky barrier detector.
Figure 8B:
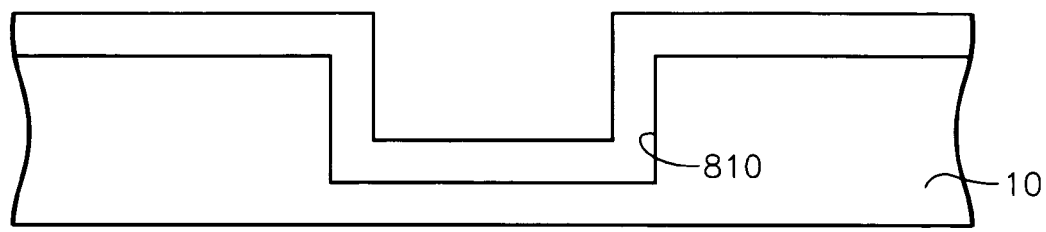
Figure 8C:
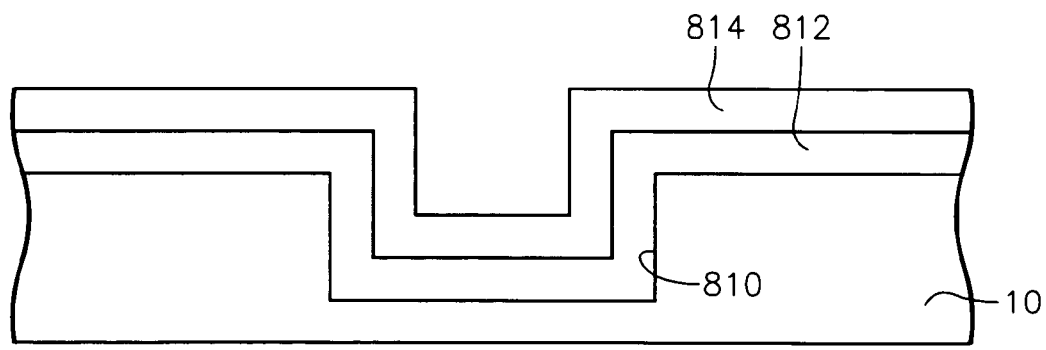
Figure 8D:
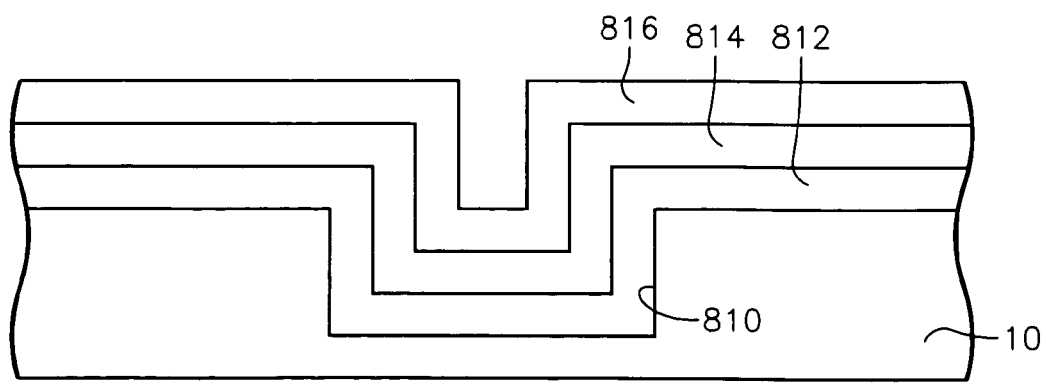
Figure 8E:
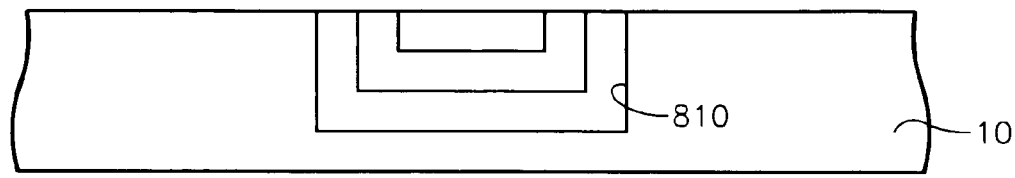
Figure 8F:
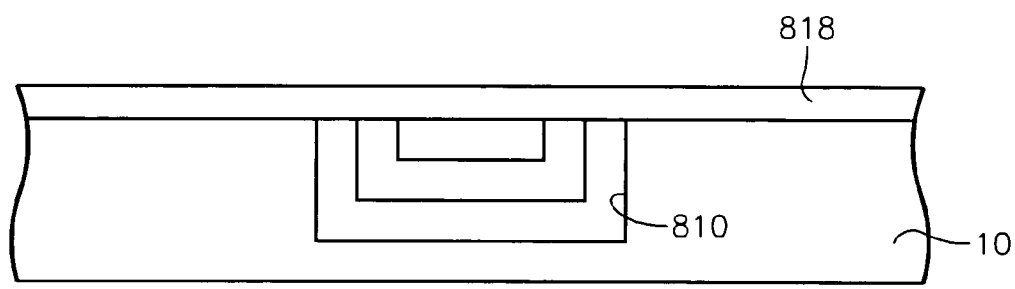
Figure 8G:
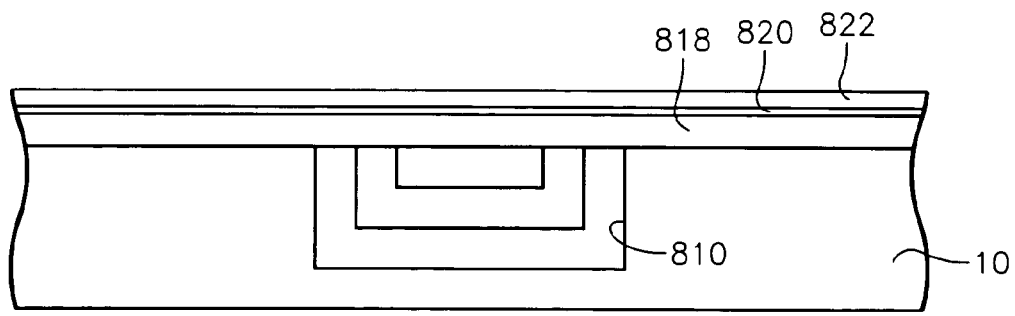
Figure 8H:
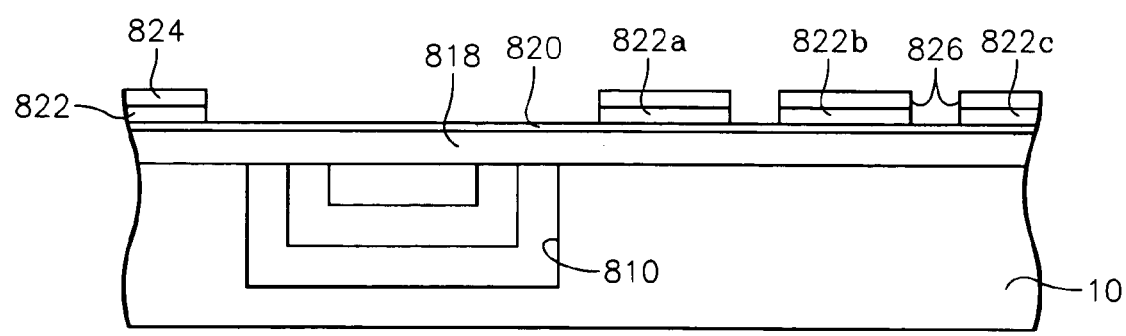
Figure 8I:
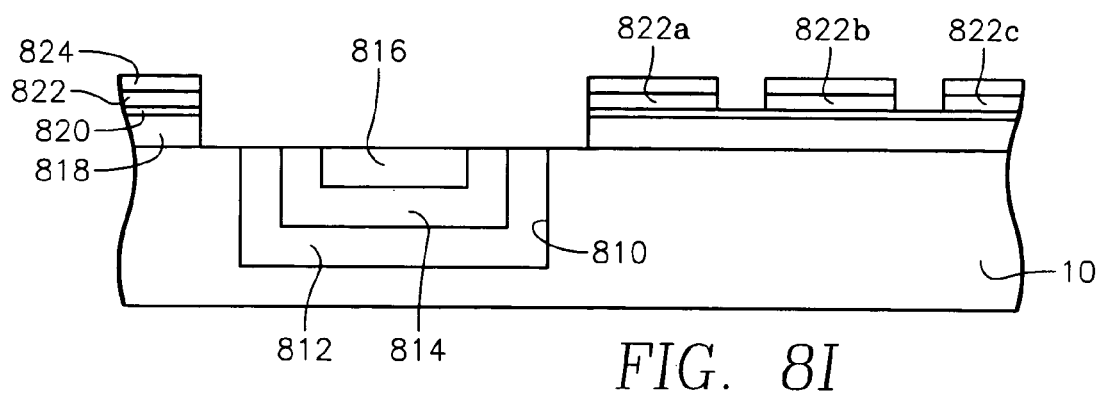
Figure 8J:
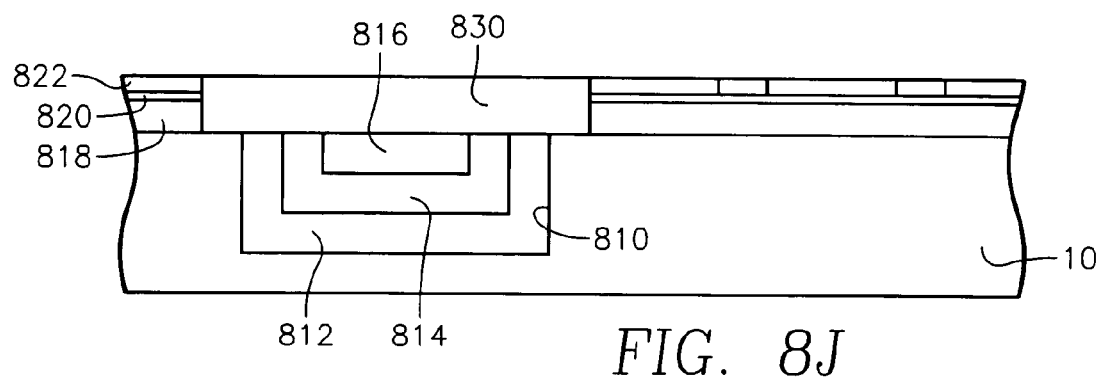
Figure 8K:
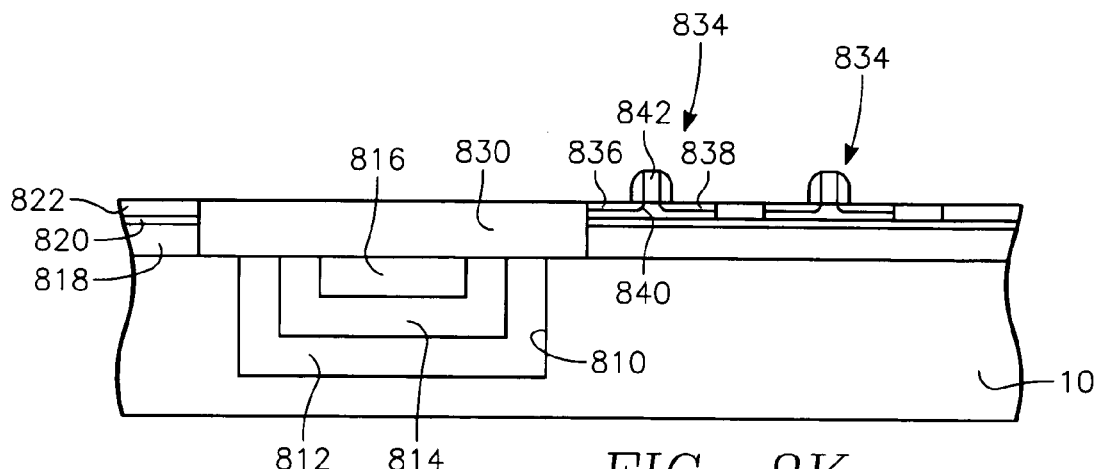
Figure 8L:
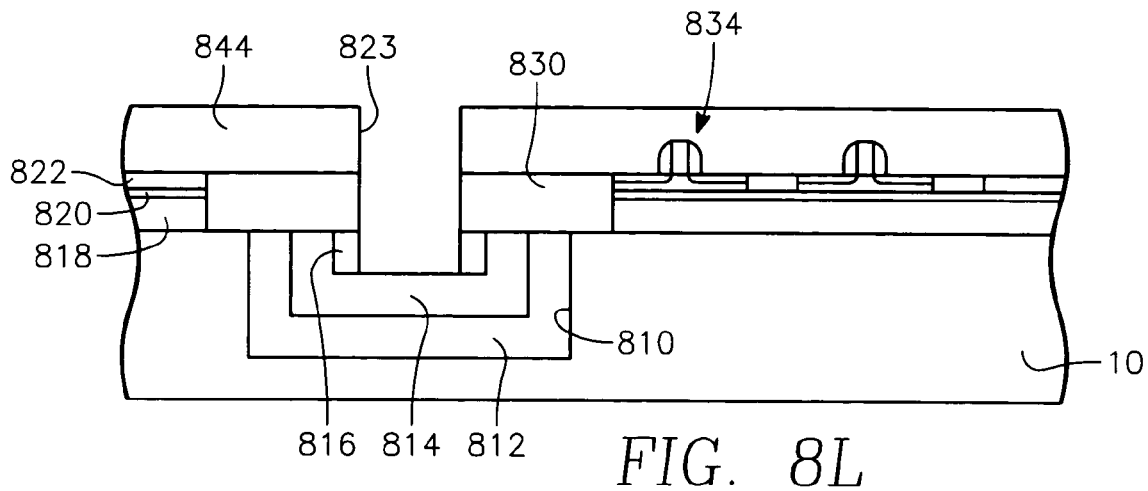
Figure 8M:
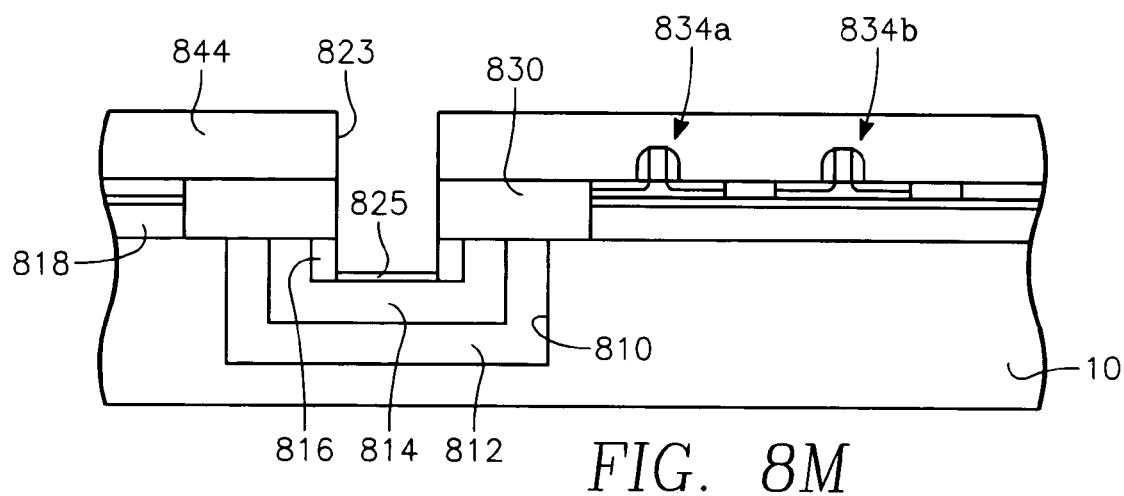
Figure 8N:
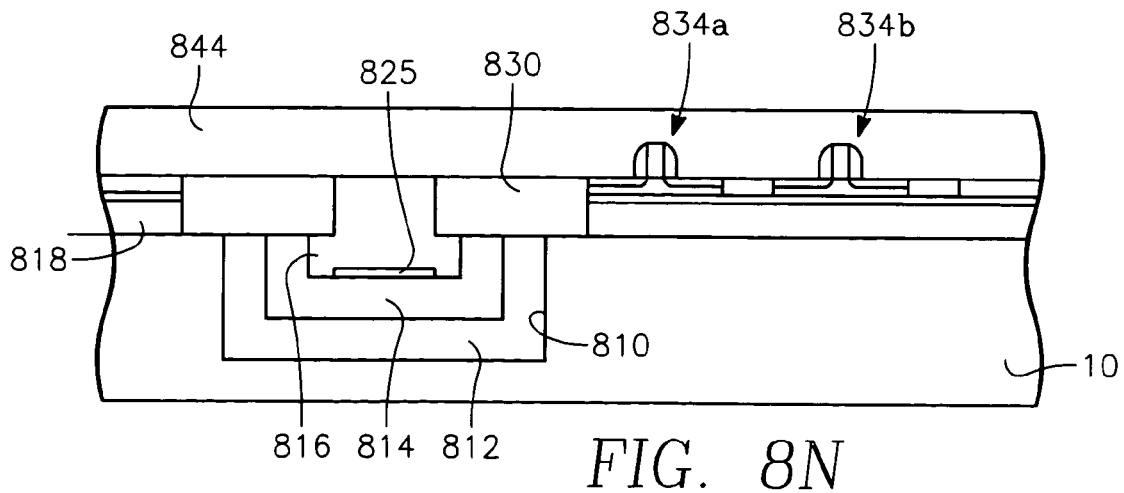
Figure 8O:
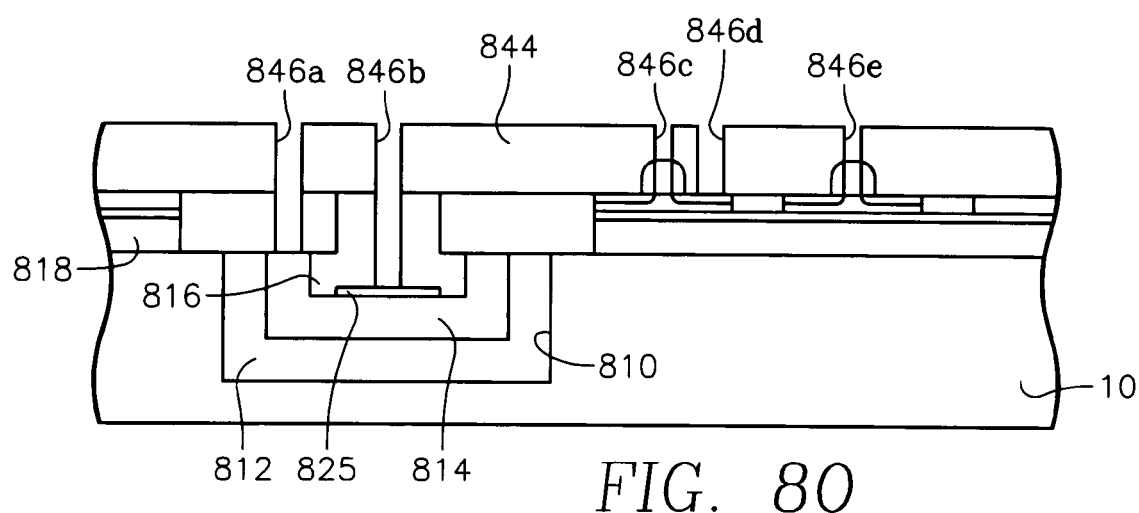
Figure 8P:
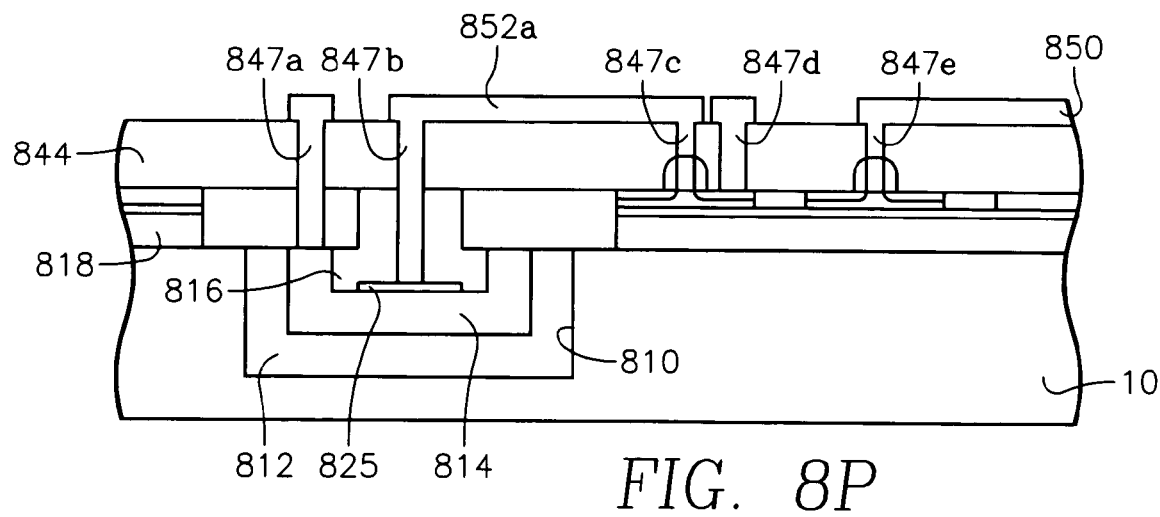

FIGS. 8A–8P illustrate a process for forming a planar integrated circuit including a planar integrated waveguide-detector, plural transistors and interconnections between some of the transistors and the integrated waveguide detector. The first step of this process is to etch an elongate trench 810 in the surface of the semiconductor substrate 10 (FIG. 8A). A highly doped silicon base layer 812 is formed over the substrate 10 by chemical vapor deposition (CVD) (FIG. 8B). A silicon-germanium waveguide core layer 814 is formed over the silicon layer 812 by CVD (FIG. 8C). The optical absorption characteristics of the silicon-germanium layer 814 may be adjusted by ion implanting a selected species into the silicon-germanium layer 814. A highly doped silicon ceiling layer 816 is formed over the silicon-germanium layer 814 by CVD (FIG. 8D). A chemical-mechanical polishing step is then performed to planarize the entire structure to make it co-planar with the top surface of the semiconductor substrate 10 (FIG. 8E). A top silicon layer 818 is then formed over the common plane of the substrate 10 and ceiling layer 816 by CVD (FIG. 8F). An insulator layer 820 and an overlying silicon layer 822 are then formed over the CVD silicon layer 818 (FIG. 8G). This may be accomplished by bonding a silicon wafer consisting of the oxide and silicon layers 820, 822 to the CVD silicon layer 818. A silicon nitride layer 824 is deposited over the silicon layer 822 and isolation openings 826 are etched down to the insulator layer 820 to form plural silicon islands 822a, 822b, 822c (FIG. 8H). A deep isolation opening 828 is etched over the buried waveguide structure 812, 814, 816 (FIG. 8I). The silicon nitride layer 824 is removed and the deep isolation opening 828 is filled with a silicon dioxide layer 830 (FIG. 8J). Then, transistors 834 are formed in the silicon islands 822, using conventional techniques. Specifically, sources 836 and drains 838 are formed by ion implantation, a thin gate oxide 840 is formed over the source-to-drain channel region and a polysilicon gate 842 is formed over each thin gate oxide layer 840 (FIG. 8K). A silicon dioxide layer 844 is deposited over the entire structure (FIG. 8L). At this point, a window 823 may be opened through the waveguide ceiling layer 816 (as indicated in FIG. 8L) and a thin metal layer may be deposited to form a Schottky barrier electrode 825 on the silicon-germanium waveguide core layer 814 (FIG. 8M). The window 823 is then refilled by restoring at least some of the layers that were removed in forming the window 823 (FIG. 8N). The thickness of at least a portion of the semiconductor layer 816 may be increased in this refilling step. Moreover, the refilled portion of the layer 816 may be polysilicon or silicon, and the final shape of the semiconductor layer 816 may be different from that illustrated in FIG. 8N. Contact openings 846 are formed (FIG. 8O). The contact opening 846a exposes the semiconductor layer or core 814. The contact opening 846b exposes the Schottky barrier electrode 825. The contact opening 846c exposes the gate 842 of the transistor 834a. The contact opening 846d exposes the drain 838 of the transistor 834a. The contact opening 846e exposes the gate of the transistor 834b. A metal layer 850 is deposited that fills the contact openings 846 to form contacts 847a–e in the respective openings 846a–e and forms metal lines 852 (FIG. 8N). The Schottky barrier reverse bias voltage is applied across the contacts 847a and 847b. The metal lines associated with the contacts 847a and 847b are normal to the plane of the drawing of FIG. 8N. For example, metal line 852a connects the Schottky barrier electrode 825 to the gate 842 of the transistor 834a. The cross-sectional view of FIG. 8N captures only a small portion of the metal contacts and interconnection lines of the integrated circuit, and is merely illustrative of some of the different types of such connections.

The waveguide core layer 814 has a U-shaped cross-section, as shown in FIG. 8N, in contrast to the rectangular-shaped waveguide core 110 of FIG. 1A. Such differences in cross-sectional shape are not necessarily critical, provided the waveguide sustains an optical waveguide mode.

While the invention has been described with respect to an embodiment in which the waveguide core has a higher index of refraction than the surrounding wall, in some cases it may be possible to reverse this relationship while carrying out the invention. Moreover, the waveguide sections between successive Schottky barrier detectors has been described as having a core surrounded by a wall (either the substrate or a separately formed wall), the core in such sections being either a semiconductor or a dielectric. However, the waveguide in the sections between Schottky barrier detectors can take other suitable forms capable of supporting an optical mode. For example, in those sections between Schottky barrier detectors, the core may contain a solid material or it may be empty, while the surrounding wall may be a semiconductor, a dielectric or a conductor, for example.

While the invention has been described in detail by specific reference to preferred embodiments, it is understood that variations and modifications thereof may be made without departing from the true spirit and scope of the invention.

What is claimed is:

1. A planar integrated circuit, comprising:
   a semiconductor substrate having a substrate surface;
   a waveguide buried in said substrate and comprising a core and a waveguide confiner around said core, said waveguide confiner including a ceiling;
   an electrode in said ceiling and contacting said core to form an interface between said electrode and said core, said interface defining a detector portion of said core, said detector portion of said core and said electrode comprising a Schottky barrier detector buried in said substrate;
   plural transistors formed in or over said substrate surface, each of said transistors comprising a source, a drain and a gate;
   an insulator layer overlying said waveguide and said plural transistors, said insulator layer having plural contact openings to respective ones of said source, drain and gate of respective ones of said transistors, to said electrode and to one of: (a) said semiconductor waveguide core, (b) said waveguide confiner; and
   a conductive interconnect layer formed over said insulator layer and comprising conductive contacts in said contact openings and conductive lines on said planar surface of said insulator layer connected to respective ones of said conductive contacts, at least one of said conductive lines forming a connection between said electrode and one of said source, drain or gate of one of said transistors.

2. The integrated circuit of claim 1 wherein said waveguide confiner has a planar ceiling surface below or co-planar with said planar substrate surface.

3. The integrated circuit of claim 1 wherein said interface is generally co-extensive with said electrode, at least the detector portion of said core comprising a semiconductor material.

4. The integrated circuit of claim 1 wherein said waveguide portions of said core have a light propagation axis parallel to said interface, whereby light of a predetermined wavelength from one of said waveguide portions of said core propagates along said interface beneath the surface of said substrate as a plasmon-polariton wave.

5. The integrated circuit of claim 1 further comprising a trench in said substrate surface containing said waveguide, said trench having a sufficient depth for said waveguide to be at or below said substrate surface.

6. The integrated circuit of claim 1 wherein said transistors are formed above said substrate surface in isolated semiconductor islands.

7. The integrated circuit of claim 1 wherein said transistors are formed in said substrate surface.

8. The integrated circuit of claim 1 wherein said core has a crosssectional shape which is one of: (a) rectangular, (b) U-shaped.

9. The integrated circuit of claim 1 wherein the waveguide portions of said core comprise one of: (a) a semiconductor material, (b) a dielectric material.

10. The integrated circuit of claim 1 further comprising a bias voltage source connected across said electrode and the detector portion of said core.

11. A planar integrated circuit, comprising:
a semiconductor substrate having a substrate surface;
a waveguide buried in said substrate and comprising a core and a waveguide confiner around said core, said waveguide confiner including a ceiling;
an electrode in said ceiling and contacting said core to form an interface between said electrode and said core, said interface defining a detector portion of said core, said detector portion of said core and said electrode comprising a Schottky barrier detector buried in said substrate;
an optical clock signal generator having an optical clock signal output coupled to said waveguide core.

12. The integrated circuit of claim 1 wherein said detector portion of said core and said electrode have a length L along the direction of propagation of light, whereby said interface is of said length L along the light propagation axis.

13. The integrated circuit of claim 12 wherein said length L of said electrode is selected in accordance with absorption of a predetermined fraction of said light by said Schottky barrier detector.

14. The integrated circuit of claim 12 further comprising plural electrodes on successive sections of said core defining successive detector portions of said core at spaced apart intervals along the light propagation axis and defining respective plural Schottky barrier detectors.

15. The integrated circuit of claim 14 wherein said plural electrodes have respective lengths along the light propagation axis, said lengths being selected in accordance with absorption of respective predetermined fractions of said light by said respective plural Schottky barrier detectors.

16. The integrated circuit of claim 15 wherein the lengths of said electrodes increase along the light propagation axis whereby said respective predetermined fractions are at least nearly the same.

17. A planar integrated circuit, comprising:
a semiconductor substrate having a substrate surface;
a waveguide buried in said substrate and comprising a core and a waveguide confiner around said core, said waveguide confiner including a ceiling;
an electrode in said ceiling and contacting said core to form an interface between said electrode and said core, said interface defining a detector portion of said core, said detector portion of said core and said electrode comprising a Schottky barrier detector buried in said substrate;
wherein said waveguide portion of said core has an index of refraction exceeding that of said waveguide confiner.

18. The integrated circuit of claim 17 wherein said waveguide confiner comprises one of: (a) an insulator material, (b) a semiconductor material, (c) said substrate.

19. An integrated circuit, comprising:
a semiconductor substrate having a substrate surface;
a waveguide medium in said substrate and having a top surface and a light propagation axis;
at least one Schottky barrier electrode formed on said top surface of said waveguide medium and defining a Schottky barrier detector comprising said electrode and a portion of said waveguide medium underlying said Schottky barrier electrode, at least said portion of said waveguide medium being a semiconductor and defining an electrode semiconductor interface parallel to said light propagation axis;
plural transistors formed in or over said substrate surface, each of said transistors comprising a source, a drain and a gate;
an insulator layer covering said substrate surface and overlying said waveguide medium and said plural transistors, said insulator layer having plural contact openings to respective ones of said source, drain and gate of respective ones of said transistors, to said electrode and to said portion of said waveguide medium;
a conductive interconnect layer formed over said insulator layer and comprising conductive contacts in said contact openings and conductive lines on said insulator layer connected to respective ones of said conductive contacts, at least one of said conductive lines forming a connection between said electrode and one of said source, drain or gate of one of said transistors.

20. The integrated circuit of claim 19 wherein said transistors are formed above said substrate surface in isolated semiconductor islands.

21. The integrated circuit of claim 19 wherein said transistors are formed in said substrate surface.

22. The integrated circuit of claim 19 wherein said waveguide medium has a cross-sectional shape which is one of: (a) rectangular, (b) U-shaped.

23. The integrated circuit of claim 19 further comprising a bias voltage source connected to said electrode.

24. The integrated circuit of claim 19 wherein said electrode has a length L along the light propagation axis.

25. The integrated circuit of claim 24 wherein said length L of said electrode is selected in accordance with absorption of a predetermined fraction of said light by said Schottky barrier detector.

26. An integrated circuit, comprising:
a semiconductor substrate having a substrate surface;
a waveguide medium in said substrate and having a top surface and a light propagation axis;
at least one Schottky barrier electrode formed on said top surface of said waveguide medium and defining a Schottky barrier detector comprising said electrode and a portion of said waveguide medium underlying said Schottky barrier electrode, at least said portion of said waveguide medium being a semiconductor and defining an electrode-semiconductor interface parallel to said light propagation axis;
plural Schottky barrier electrodes formed on said top surface of said waveguide medium at spaced apart intervals along a length of said waveguide medium in said light propagation direction, and defining respective plural Schottky barrier detectors comprising the respective plural Schottky barrier electrodes and the respective portions of said waveguide medium underlying said respective Schottky barrier electrodes at said spaced apart intervals, and further defining intervening sections of said waveguide medium between said respective portions underlying said Schottky barrier electrodes.

27. The integrated circuit of claim 26 further comprising:
an optical clock signal generator having an optical clock signal output coupled to said waveguide medium.

28. The integrated circuit of claim 26 wherein said waveguide medium is a semiconductor in both said respective portions and in said intervening sections.

29. The integrated circuit of claim 26 wherein said waveguide medium comprises semiconductor material within said respective portions of said waveguide medium underlying said respective Schottky barrier electrodes and comprises dielectric material in said intervening sections between said respective portions.

30. The integrated circuit of claim 26 wherein said plural electrodes have respective lengths along the direction of propagation of said light, said lengths being selected in accordance with absorption of respective predetermined fractions of said light by said respective plural Schottky barrier detectors.

31. The integrated circuit of claim 30 wherein the lengths of said electrodes increase along the direction of propagation of said light whereby said respective predetermined fractions are at least nearly the same.

32. An integrated circuit, comprising:
a semiconductor substrate having a substrate surface;
a waveguide medium in said substrate and having a top surface and a light propagation axis;
at least one Schottky barrier electrode formed on said top surface of said waveguide medium and defining a Schottky barrier detector comprising said electrode and a portion of said waveguide medium underlying said Schottky barrier electrode, at least said portion of said waveguide medium being a semiconductor and defining an electrode-semiconductor interface parallel to said light propagation axis;
a waveguide wall element surrounding said waveguide medium;
wherein said waveguide wall element comprises base, a ceiling and a pair of side walls.

33. The integrated circuit of claim 32 wherein said waveguide wall element has a lower refractive index than said waveguide medium.

34. An integrated circuit, comprising:
a semiconductor substrate having a substrate surface;
a waveguide medium in said substrate and having a top surface and a light propagation axis;
at least one Schottky barrier electrode formed on said top surface of said waveguide medium and defining a Schottky barrier detector comprising said electrode and a portion of said waveguide medium underlying said Schottky barrier electrode, at least said portion of said waveguide medium being a semiconductor and defining an electrode-semiconductor interface parallel to said light propagation axis;
wherein said waveguide medium is buried in the interior of said substrate at a sufficient depth so that said waveguide medium does not protrude above the surface of said substrate.

35. An integrated circuit, comprising:
a semiconductor substrate having a substrate surface;
a waveguide medium in said substrate and having a top surface and a light propagation axis;
at least one Schottky barrier electrode formed on said top surface of said waveguide medium and defining a Schottky barrier detector comprising said electrode and a portion of said waveguide medium underlying said Schottky barrier electrode, at least said portion of said waveguide medium being a semiconductor and defining an electrode-semiconductor interface parallel to said light propagation axis;
wherein said waveguide has a tapered shape in a plane parallel to a plane of said interface.

36. The integrated circuit of claim 35 wherein said tapered shape is a transition from a narrow width to a wider width along the direction of light propagation.

37. In an integrated circuit comprising a semiconductor substrate and plural transistors formed in or over said substrate, a method of propagating a signal to a set of said plural transistors, comprising:
providing a buried optical waveguide core in said substrate that extends near respective ones of said set of plural transistors;
providing plural Schottky barrier detectors buried in said substrate as respective electrodes contacting respective top portions of said waveguide core near the respective ones of said set of plural transistors;
coupling respective ones of said electrodes to respective ones of said set of plural transistors;
propagating a light beam modulated with said signal through said waveguide core.

38. The method of claim 37 wherein the step of propagating a light beam through said waveguide core comprises propagating a plasma-polariton wave along an interface between each said electrode and said waveguide core.

39. The method of claim 37 wherein said waveguide core extends near each of said set of plural transistors from a beginning point, and wherein the step of propagating a light beam comprises generating an optical clock signal in a clock signal generator and propagating said optical clock signal through said waveguide core from said beginning point to each of said Schottky barrier detectors.

40. The method of claim 37 further comprising applying bias voltages across said Schottky barrier detectors.

41. The method of claim 37 wherein the step of propagating a light beam comprises propagating the light beam along an optical axis generally parallel to interfaces between said electrodes and said waveguide core.

42. The method of claim 37 further comprising increasing the length of each successive electrode along the path of said light beam.

43. The method of claim 37 further comprising apportioning the amount of light incident on each detector by apportioning the respective lengths of said electrodes along the direction of light propagation in said waveguide core.

44. The method of claim 37 further comprising surrounding the sides of said waveguide core with a waveguide confiner having an optical index of refraction different from that of said waveguide core.

* * * * *